United States Patent
Zhang et al.

(10) Patent No.: US 11,630,167 B2
(45) Date of Patent: Apr. 18, 2023

(54) POSITION SENSING SYSTEM WITH IMPROVED ACCURACY AND THE METHOD THEREOF

(71) Applicant: Chengdu Monolithic Power Systems Co., Ltd., Chengdu (CN)

(72) Inventors: Tianzhu Zhang, Chengdu (CN); Serge Reymond, Saint-Julien-en-Genevois (FR); Pavel Kejik, Ecublens (CH)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 17/579,055

(22) Filed: Jan. 19, 2022

(65) Prior Publication Data

US 2022/0236345 A1     Jul. 28, 2022

(30) Foreign Application Priority Data

Jan. 25, 2021   (CN) .......................... 202110100602.4

(51) Int. Cl.
*G01R 33/07*     (2006.01)
*G01R 33/00*     (2006.01)

(52) U.S. Cl.
CPC ....... *G01R 33/075* (2013.01); *G01R 33/0035* (2013.01)

(58) Field of Classification Search
CPC .............. G01R 33/075; G01R 33/0035; G01R 33/077; G01B 7/003; G01B 7/30
See application file for complete search history.

(56) References Cited

U.S. PATENT DOCUMENTS

| | | | |
|---|---|---|---|
| 8,324,891 B2 | 12/2012 | Kejik et al. | |
| 8,358,125 B2 | 1/2013 | Moser et al. | |
| 8,508,218 B2 | 8/2013 | Reymond et al. | |
| 8,963,540 B2 | 2/2015 | Reymond et al. | |
| 9,448,288 B2 | 9/2016 | Diaconu | |
| 9,453,892 B2 | 9/2016 | Kejik et al. | |
| 9,851,417 B2* | 12/2017 | Kosier | G01R 33/0082 |
| 9,880,025 B2 | 1/2018 | Kejik et al. | |
| 9,945,691 B2 | 4/2018 | Reymond | |
| 9,945,912 B2 | 4/2018 | Hioka et al. | |
| 2010/0060263 A1* | 3/2010 | Granig | G01D 5/145 324/202 |
| 2011/0133723 A1* | 6/2011 | Forsyth | G01D 5/145 324/207.2 |
| 2017/0030979 A1* | 2/2017 | Cesaretti | G01R 33/0035 |
| 2017/0336481 A1* | 11/2017 | Latham | G01R 33/077 |

* cited by examiner

*Primary Examiner* — Alvaro E Fortich
(74) *Attorney, Agent, or Firm* — Perkins Coie LLP (57) ABSTRACT

A position sensing system has a trim unit to trim hall voltages generated by a first sensor and a second sensor in response to an excitation current, to compensate a non-orthogonality of the first sensor and the second sensor.

11 Claims, 5 Drawing Sheets

Figure 11

POSITION SENSING SYSTEM WITH IMPROVED ACCURACY AND THE METHOD THEREOF

CROSS-REFERENCE TO RELATED APPLICATIONS

This application claims priority to and the benefit of Chinese Patent Application No. 202110100602.4, filed Jan. 25, 2021, which is incorporated herein by reference in its entirety.

FIELD

The present invention relates to sensor, more specifically, the present invention relates to position sensing system and position sensing method.

BACKGROUND

Figure 1:
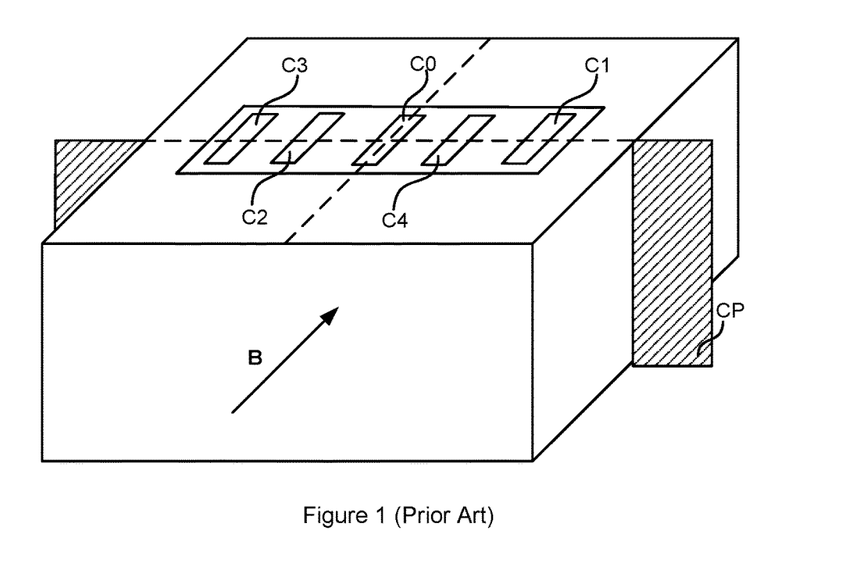
FIG. 1 schematically shows a typical integrated vertical hall effect device.
Figure 2:
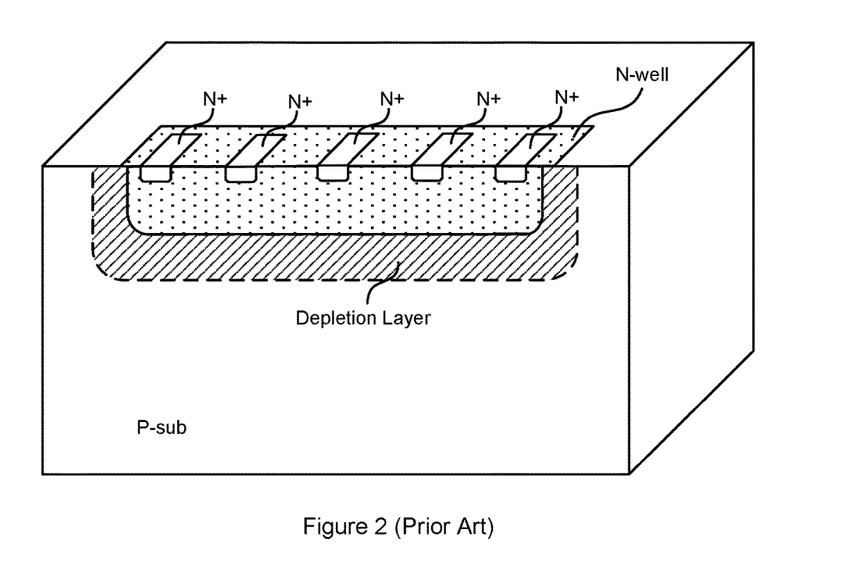
FIG. 2 schematically shows the hall effect device in FIG. 1 with a cross-section view along the CP slice.
Figure 3:
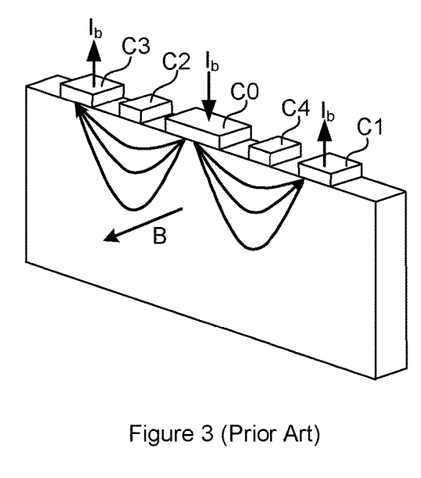
FIG. 3 schematically shows the internal current flowing when one pair of the connectors is applied with an excitation current.

Hall effect devices are used in various applications. One of the applications is in the area of position sensor. A typical integrated vertical hall effect device is shown in FIG. 1. As shown in FIG. 1, the hall effect device has two pairs of connectors (a first pair of connectors C0, C1 & C3, and a second pair of connectors C2 & C4; or a first pair of connectors C0, C2 & C4, and a second pair of connectors C1 & C3). FIG. 2 schematically shows the hall effect device in FIG. 1 with a cross-section view along the CP slice. As shown in FIG. 2, the connectors are N-type highly doped regions (N+) formed in an N-type well region (N-well), which is formed on a P-type substrate (P-sub). When a magnetic field B is applied perpendicular to a plane of the Hall effect device, and a current is applied to one pair of the connectors, as shown in FIG. 3, when the applied current has a direction from C0 to C1 and to C3, a hall voltage is generated across connectors C2 and C4. A depletion layer which functions as an isolation layer is generated at the junction of the N-well and the P-sub when the current is applied to the Hall effect device and an appropriate voltage level is applied to the P-sub with respect to the voltage level of the connectors.

Figure 4:
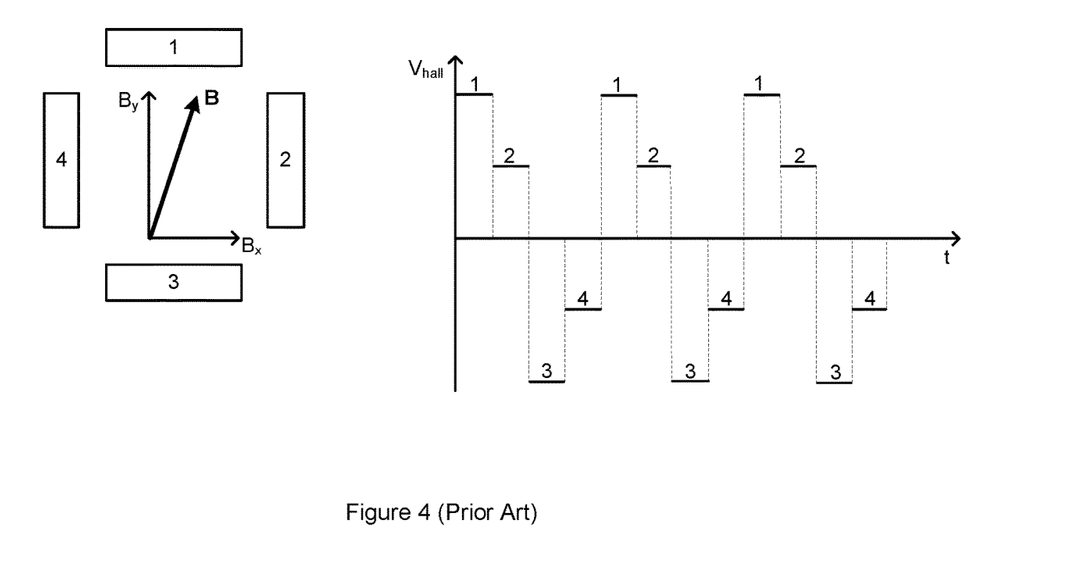
FIG. 4 schematically shows a position detection using perpendicular method.

Position sensing technology typically adopts one pair or two pairs of vertical hall effect devices placed in perpendicular with each other. FIG. 4 schematically shows a position detection using perpendicular method. Hall effect devices 1, 2, 3 and 4 are fabricated in an IC chip, and are placed in perpendicular with each other (e.g., the hall effect device 1 and 3 are placed along Bx direction, while the hall effect device 2 and 4 are placed along By direction as shown in FIG. 4). When the magnetic field B has a direction as shown as in the left section of FIG. 4, if a current is applied to one pair connectors of the hall effect devices 1, 2, 3 and 4, a hall voltage Wall would be generated at the other pair connectors of the hall effect devices 1, 2, 3 and 4, as shown in the right section of FIG. 4. Thus, a magnetic field angle would be calculated by comparing a sine wave with a reference wave, wherein the sine wave is obtained by filtering the detected hall voltages.

However, errors always exist during the fabrication of the IC chip, and the hall effect devices may not be exactly orthogonal with each other, typically shifted with a certain angle, which leads to inaccurate detection.

SUMMARY

It is an object of the present invention to provide, which solves the above problems.

In accomplishing the above and other objects, there has been provided, in accordance with an embodiment of the present invention, a position sensing system, comprising: a sensing unit, having a first sensor and a second sensor, both configured to induce a magnetic field; an exciting unit, configured to apply an excitation current having a clock cycle to the first sensor and the second sensor, and to sample hall voltage signals generated by the first sensor and the second sensor; a trim unit, configured to trim the hall voltages to generate a trim signal, so as to compensate a non-orthogonality of the first sensor and the second sensor; a control unit, configured to control a current direction and a spinning scheme of the excitation current, and to control the trim of the hall voltages; and a signal process unit, configured to generate a signal indicative of position information of the magnetic field in response to the trim signal.

In addition, there has been provided, in accordance with an embodiment of the present invention, a position sensing system, comprising: a first sensing unit, having a first sensor and a second sensor, both configured to induce a magnetic field; a second sensing unit, having a first sensor and a second sensor, both configured to induce the magnetic field; an exciting unit, configured to in turn apply an excitation current having a clock cycle to the first sensing unit and the second sensing unit, and to sample a first hall voltage signal generated by the first sensing unit and a second hall voltage signal generated by the second sensing unit; a trim unit, configured to add a product of the second hall voltage signal and a first coefficient into the first hall voltage signal, to generate a trim signal, so as to compensate a non-orthogonality between the first sensor and the second sensor in the first sensing unit, and to compensate a non-orthogonality between the first sensor and the second sensor in the second sensing unit; and a signal process unit, configured to generate a signal indicative of position information of the magnetic field in response to the trim signal.

Furthermore, there has been provided, in accordance with an embodiment of the present invention, a position sensing method, comprising: applying an excitation current to a sensing unit placed at a magnetic field, and sampling a corresponding hall voltage signal generated based thereupon, the sensing unit including a first sensor and a second sensor; trimming the hall voltage signal, to compensate a non-orthogonality between the first sensor and the second sensor, to generate a trim signal; processing the trim signal to obtain position information of the magnetic field.

The use of the similar reference label in different drawings indicates the same of like components.

DETAILED DESCRIPTION

Embodiments of circuits for position sensing system are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

Figure 5:
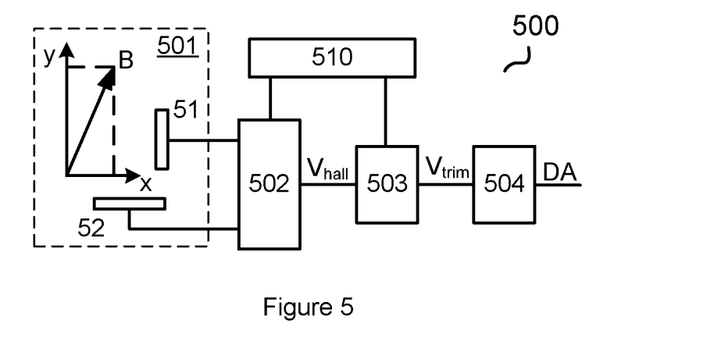
FIG. 5 schematically shows a circuit configuration of a position sensing system 500 in accordance with an embodiment of the present invention.

FIG. 5 schematically shows a circuit configuration of a position sensing system 500 in accordance with an embodiment of the present invention. As shown in FIG. 5, the position sensing system 500 comprises a sensing unit 501, having a first sensor 51 and a second sensor 52 configured to induce a magnetic field B. The position sensing system 500 further comprises an exciting unit 502, a trim unit 503, a control unit 510, and a signal process unit 504. The exciting unit 502 is configured to apply an excitation current having a clock cycle to the first sensor 51 and the second sensor 52, and to sample hall voltage signals Wall generated by the first sensor 51 and the second sensor 52. The trim unit 503 is configured to trim the hall voltages $V_{hall}$ to generate a trim signal $V_{trim}$, so as to compensate a non-orthogonality of the first sensor 51 and the second sensor 52. The control unit 510 is configured to control a current direction and a spinning scheme of the excitation current, and to control the trim of the hall voltages. The signal process unit 504 is configured to generate a signal DA indicative of position information of the magnetic field B in response of the trim signal $V_{trim}$.

In one embodiment of the present invention, the sensing unit 501 is configured to sense an angular position information or linear position information of the magnetic field B. The first sensor 51 and the second sensor 52 are placed in perpendicular with each other, and are placed in the y direction and in the x direction of a sensing plane, respectively. Under the control of the control unit 510, the exciting unit 502 applies the excitation current to the first sensor 51 and the second sensor 52 by turn, and the excitation current has a current direction varied with time. Specifically, the current direction of the excitation current is changed each quarter of the clock cycle, so that a corresponding hall voltage signal $V_{hall}$(+x, +y, −x, −y) is by turn generated in the directions of +x, +y, −x and −y at each quarter of the clock cycle. That is, the hall voltage is generated in the +x direction at a first quarter of the clock cycle. The hall voltage is generated in the +y direction at a second quarter of the clock cycle. The hall voltage is generated in the −x direction at a third quarter of the clock cycle. And the hall voltage is generated in the −y direction at a fourth quarter of the clock cycle. The hall voltage Wall is then compensated by the trim unit 503 in the directions of +x, +y, −x and −y under the control of the control unit 510, to generate the trim signal $V_{trim}$.

In one embodiment of the present invention, the hall voltage Wall is respectively compensated by the trim unit 503 in the directions of +x, +y, −x and −y at each quarter of the clock cycle. The compensation comprises: a) multiplying the hall voltage in the +y direction with a first coefficient k1, which is then added to the hall voltage in the +x direction; b) multiplying the hall voltage in the +x direction with the first coefficient k1, which is then added to the hall voltage in the +y direction; c) multiplying the hall voltage in the −y direction with the first coefficient k1, which is then added to the hall voltage in the −x direction; and d) multiplying the hall voltage in the −x direction with the first coefficient k1, which is then added to the hall voltage in the −y direction, then the trim signal is obtained as $V_{trim}$(+x+k1*y, +y+k1*x, −x−k1*y, −y−k1*x).

In one embodiment of the present invention, the hall voltage in the +x direction means the hall voltage generated at one pair connectors of the sensor 51 which is placed in the y direction of the sensing plane, when the other pair connectors of the sensor 51 is applied with the excitation current with a first current direction (e.g. positive direction). The hall voltage in the −x direction means the hall voltage generated at one pair connectors of the sensor 51, when the other pair connectors of the sensor 51 is applied with the excitation current with a second current direction (e.g. negative direction). The hall voltage in the +y direction means the hall voltage generated at one pair connectors of the sensor 52 which is placed in the x direction of the sensing plane, when the other pair connectors of the sensor 52 is applied with the excitation current with the first current direction. The hall voltage in the −y direction means the hall voltage generated at one pair connectors of the sensor 52, when the other pair connectors of the sensor 52 is applied with the excitation current with the second current direction (e.g. negative direction).

In one embodiment of the present invention, the trim unit 503 is configured to perform the compensation on the hall voltage signal Wall from the directions of +x, +y, −x, and −y, respectively. The compensation comprises: dividing a frequency of the hall voltage signal in each of the directions into two halves, to obtain a first signal and a second signal with same time length in each of the directions. In either the +x direction and the −x direction, the first signal is maintained, while the second signal is multiplied with a second coefficient k2. And in either the +y direction and the −y direction, the first signal is multiplied with the second coefficient k2, while the second signal is maintained. Then the trim signal $V_{trim}$ would be (+x, +k2*x, +k2*y, +y, −x, −k2*x, −k2*y, −y).

In one embodiment of the present invention, the sensor (51 and/or 52) comprises a hall effect device.

Figure 6:
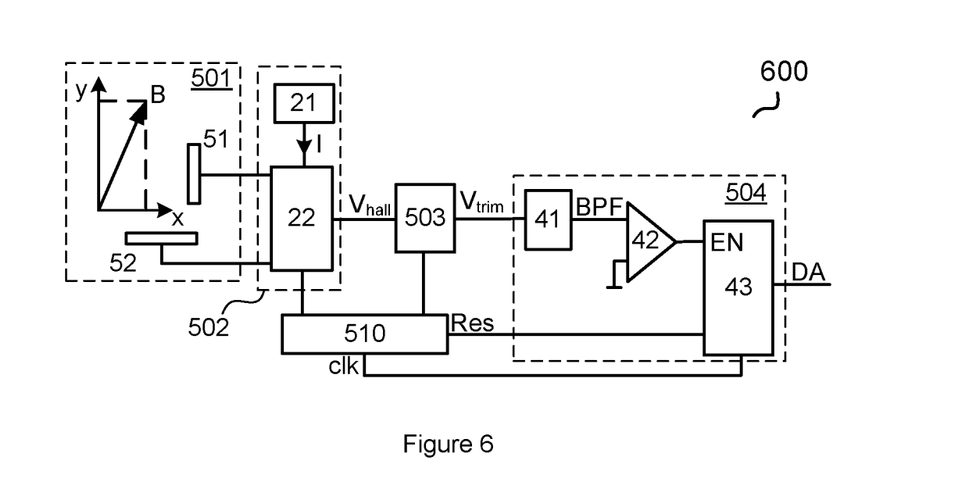
FIG. 6 schematically shows a circuit configuration of a position sensing system 600 in accordance with an embodiment of the present invention.

FIG. 6 schematically shows a circuit configuration of a position sensing system 600 in accordance with an embodiment of the present invention. In the example of FIG. 6, the circuit configurations of the exciting unit 502 and the signal process unit 504 are schematically shown. Specifically, in the example of FIG. 6, the exciting unit 502 comprises: a current source circuit 21, configured to provide an excitation current I; and a wiring unit 22, configured to deliver the excitation current to the sensing unit 501 under the control of the control unit 510, so that the corresponding sensor (e.g., sensor 51 or sensor 52) is selected to have one pair connectors flow the excitation current, and the hall voltage signal is generated at the other pair connectors at different time periods. The signal process unit 504 comprises: a filtering unit 41 (e.g., a band-pass filter), configured to filter the trim signal $V_{trim}$, to generate a filter signal BPF; a comparing circuit 42, configured to compare the filter signal BPF with a reference signal, to generate a comparison signal; and a phase detect unit 43, configured to generate the position signal DA in response to the comparison signal, a clock signal clk, and a reset signal Res provided by the control unit 510. The clock signal clk has the clock cycle.

In one embodiment of the present invention, the reference signal comprises a reference zero voltage, e.g. the ground potential.

Figure 7:
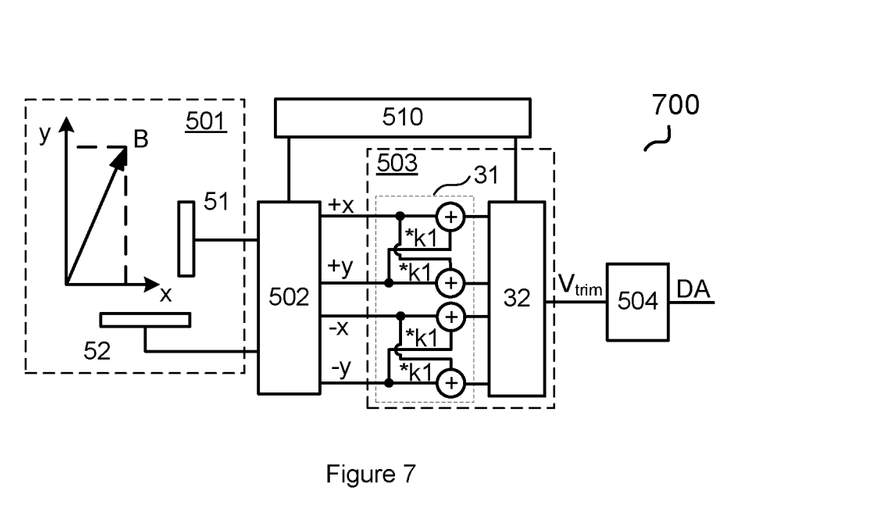
FIG. 7 schematically shows a circuit configuration of a position sensing system 700 in accordance with an embodiment of the present invention.

FIG. 7 schematically shows a circuit configuration of a position sensing system 700 in accordance with an embodiment of the present invention. In the example of FIG. 7, the circuit configuration of the trim unit 503 is schematically shown. Specifically, in the example of FIG. 7, the trim unit 503 comprises: an add unit 31, configured to respectively compensate the hall voltages in the directions of +x, +y, −x and −y with a first coefficient k1, to generate a compensated signal. Specifically, a product of the hall voltage in the +y direction and the first coefficient k1 is added to the hall voltage in the +x direction. A product of the hall voltage in the +x direction and the first coefficient K1 is added to the hall voltage in the +y direction. A product of the hall voltage in the −y direction and the first coefficient k1 is added to the hall voltage in the −x direction. And a product of the hall voltage in the −x direction and the coefficient is added to the hall voltage in the −y direction. In the example of FIG. 7, the trim unit 503 further comprises: a multiplexer 32, configured to pick out the hall voltages (i.e., the compensated signal) from the add unit 31 under the control of the control unit 510, to generate the trim signal $V_{trim}$ (+x+k1*y, +y+k1*x, −x−k1*y, −y−k1*x). That is, at the first quarter of each clock cycle, the trim signal $V_{trim}$ is the sum of the hall voltage in the +x direction and the product of the hall voltage in the +y direction and the first coefficient k1. At the second quarter of each clock cycle, the trim signal $V_{trim}$ is the sum of the hall voltage in the +y direction and the product of the hall voltage in the +x direction and the first coefficient k1. At the third quarter of each clock cycle, the trim signal $V_{trim}$ is the sum of the hall voltage in the −x direction and the product of the hall voltage in the −y direction and the first coefficient k1. At the fourth quarter of each clock cycle, the trim signal $V_{trim}$ is the sum of the hall voltage in the −y direction and the product of the hall voltage in the −x direction and the first coefficient k1.

Figure 8:
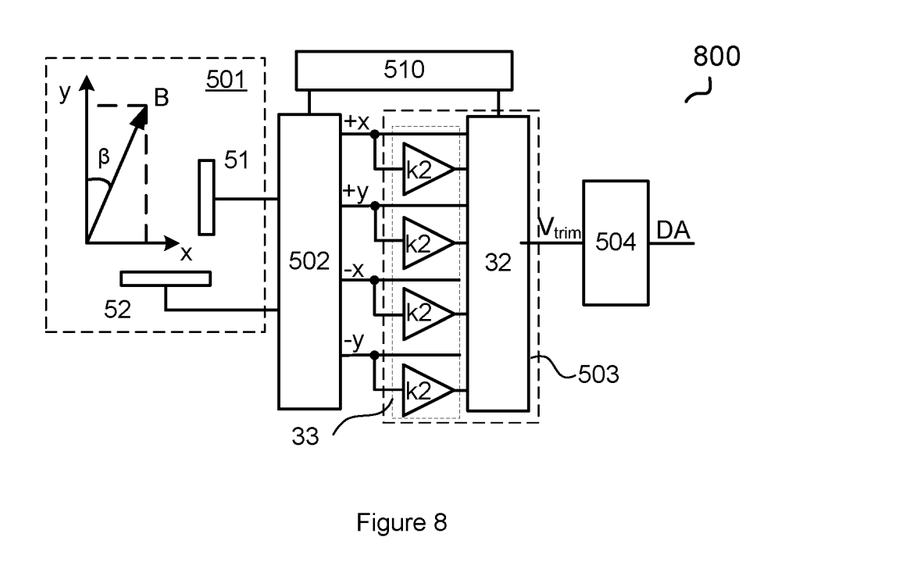
FIG. 8 schematically shows a circuit configuration of a position sensing system 800 in accordance with an embodiment of the present invention.

FIG. 8 schematically shows a circuit configuration of a position sensing system 800 in accordance with an embodiment of the present invention. In the example of FIG. 8, the circuit configuration of the trim unit 503 is schematically shown. Specifically, in the example of FIG. 8, the trim unit 503 comprises: a frequency divide unit 33, configured to divide a frequency of the hall voltages into two halves in each of the +x, +y, −x and −y directions, to respectively obtain a first signal and a second signal with same time length in each of the directions. In +x direction and −x direction, the first signal is maintained, while the second signal is multiplied with a second coefficient k2. In either +y direction and −y direction, the first signal is multiplied with the second coefficient k2, while the second signal is maintained. In the example of FIG. 8, the trim unit 503 further comprises: a multiplexer 32, configured to pick out an output signal from the frequency divide unit 33, to generate the trim signal $V_{trim}$ (+x, +k2*x, +k2*y, +y, −x, −k2*x, −k2*y, −y). That is, at the first ⅛ cycle of each clock cycle, the trim signal $V_{trim}$ is the hall voltage signal in the +x direction. At the second ⅛ cycle of each clock cycle, the trim signal $V_{trim}$ is the product of the hall voltage signal in the +x direction and the second coefficient k2. At the third ⅛ cycle of each clock cycle, the trim signal $V_{trim}$ is the product of the hall voltage signal in the +y direction and the second coefficient k2. At the fourth ⅛ cycle of each clock cycle, the trim signal $V_{trim}$ is the hall voltage signal in the +y direction. At the fifth ⅛ cycle of each clock cycle, the trim signal $V_{trim}$ is the hall voltage signal in the −x direction. At the sixth ⅛ cycle of each clock cycle, the trim signal $V_{trim}$ is the product of the hall voltage signal in the −x direction and the second coefficient k2. At the seventh ⅛ cycle of each clock cycle, the trim signal $V_{trim}$ is the product of the hall voltage signal in the −y direction and the second coefficient k2. At the eighth (i.e., the last) ⅛ cycle of each clock cycle, the trim signal $V_{trim}$ is the hall voltage signal in the −y direction.

In one embodiment of the present invention, the first coefficient k1 and the second coefficient k2 are both between 0 and 1, while k1 is close to 0, e.g., k1=0.01, and k2 is close to 1, e.g., k2=0.99.

Figure 9:
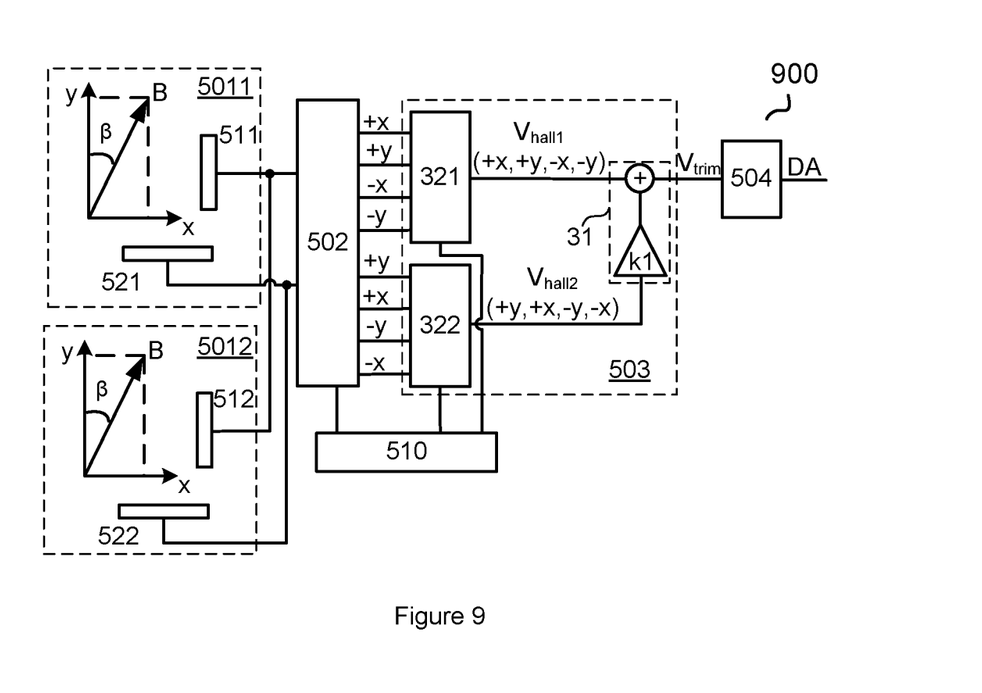
FIG. 9 schematically shows a circuit configuration of a position sensing system 900 in accordance with an embodiment of the present invention.

FIG. 9 schematically shows a circuit configuration of a position sensing system 900 in accordance with an embodiment of the present invention. In the example of FIG. 9, the system 900 comprises: a first sensing unit 5011 and a second sensing unit 5012. The first sensing unit 5011 has a first sensor 511 and a second sensor 521, both configured to induce a magnetic field B. The second sensing unit 5012 has a first sensor 512 and a second sensor 522, both configured to induce the magnetic field B. The position sensing system 900 further comprises: an exciting unit 502, a trim unit 503, and a signal process unit 504. The exciting unit 502 is configured to apply an excitation current with clock cycle to the first sensing unit 5011 and the second sensing unit 5012, and to sample a first hall voltage signal $V_{hall1}$(+x, +y, −x, −y) generated by the first sensing unit 5011 and a second hall voltage signal $V_{hall2}$(+y, +x, −y, −x) generated by the second sensing unit 5012. The trim unit 503 is configured to add a product of the second hall voltage signal $V_{hall2}$ and a first coefficient k1 into the first hall voltage signal $V_{hall1}$, to generate a trim signal $V_{trim}$, so as to compensate a non-orthogonality between the first sensor 511 and the second sensor 521 in the first sensing unit 5011, and to compensate a non-orthogonality between the first sensor 512 and the second sensor 522 in the second sensing unit 5012. The signal process unit 504 is configured to generate a signal DA indicative of position information of the magnetic field B in response to the trim signal $V_{trim}$.

In one embodiment of the present invention, in the first sensing unit 5011, the first sensor 511 is placed at the y direction of the sensing plane, and the second sensor 521 is placed at the x direction. In the second sensing unit 5012, the first sensor 512 is placed at the y direction, and the second sensor 522 is placed at the x direction. The exciting unit 502 applies the excitation current to the first sensing unit 5011 and the second sensing unit 5012 by turn, and the excitation current has a current direction varied with time. Specifically, the current direction of the excitation current is changed each quarter of the clock cycle. Consequently, in the first sensing unit 5011, a corresponding hall voltage is generated by turn in the directions of +x, +y, −x and −y at each quarter of the clock cycle, to form the first hall voltage $V_{hall1}$(+x, +y, −x, −y). That is, in the first sensing unit 5011, the hall voltage is generated in the +x direction at a first quarter of the clock cycle. The hall voltage is generated in the +y direction at a second quarter of the clock cycle. The hall voltage is generated in the −x direction at a third quarter of the clock cycle. And the hall voltage is generated in the −y direction at a fourth quarter of the clock cycle. In the second sensing unit 5012, a corresponding hall voltage is also generated by turn in the directions of +y, +x, −y and −x at each quarter of the clock cycle, to form the second hall voltage $V_{hall2}$(+y, +x, −y, −x). That is, in the second sensing unit 5012, a corresponding hall voltage is generated in the +y direction at the first quarter of the clock cycle. A corresponding hall voltage is generated in the +x direction at the second quarter of the clock cycle. A corresponding hall voltage is generated in the −y direction at the third quarter of the clock cycle. And a corresponding hall voltage is generated in the −x direction at the fourth quarter of the clock cycle.

In the example of FIG. 9, the trim unit 503 comprises: a first multiplexer 321, a second multiplexer 322, and an add unit 31. The first multiplexer 321 is configured to pick out the hall voltages generated by the first sensing unit 5011 by turn from the directions of +x, +y, −x and −y at each quarter of the clock cycle. The second multiplexer 322 is configured to pick out the hall voltages generated by the second sensing unit 5012 by turn from the directions of +y, +x, −y and −x at each quarter of the clock cycle. The add unit 31 is configured to add the hall voltages from the first multiplexer 321 multiplied with the first coefficient k1 to the hall voltage signal from the second multiplexer 322, to generate the trim signal $V_{trim}$.

Figure 10:
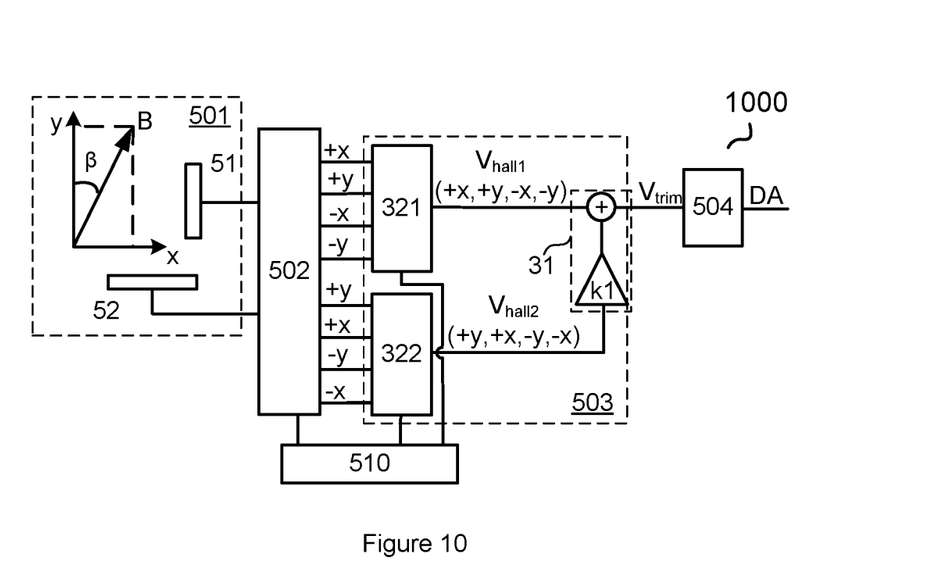
FIG. 10 schematically shows a circuit configuration of a position sensing system 1000 in accordance with an embodiment of the present invention.

FIG. 10 schematically shows a circuit configuration of a position sensing system 1000 in accordance with an embodiment of the present invention. In the example of FIG. 10, the system 1000 comprises: a sensing unit 501, an exciting unit 502, a trim unit 503, a control unit 510, and a signal process unit 504. The sensing unit 501 has a first sensor 51 and a second sensor 52 configured to induce a magnetic field B, the first sensor 51 being placed at the x direction of a sensing plane, and the second sensor 52 being placed at the y direction of the sensing plane. The exciting unit 502 is configured to apply an excitation current having a clock cycle to the first sensor 51 and the second sensor 52 simultaneously, and to sample a first hall voltage signal $V_{hall1}$ and a second hall voltage signal $V_{hall2}$ respectively generated by the first sensor 51 and the second sensor 52. The trim unit 503 is configured to trim the first hall voltage \ham and the second hall voltage signal $V_{hall2}$ to generate a trim signal $V_{trim}$, so as to compensate a non-orthogonality of the first sensor 51 and the second sensor 52. The control unit 510 is configured to control a current direction and a spinning scheme of the excitation current, and to control the trim of the first hall voltage and the second hall voltage. The signal process unit 504 is configured to generate a signal DA indicative of position information of the magnetic field B in response to the trim signal $V_{trim}$.

In one embodiment of the present invention, the excitation currents applied to the first sensor 51 and the excitation current applied to the second sensor 52 have opposite current directions at any specific time point: when the first sensor 51 is applied with a positive excitation current, the second sensor 52 is applied with a negative excitation current; and when the first sensor 51 is applied with a negative excitation current, the second sensor 52 is applied with a positive excitation current.

In the example of FIG. 10, the trim unit 503 comprises: a first multiplexer 321, a second multiplexer 322, and an add unit 31. The first multiplexer 321 is configured to pick out the hall voltage generated by the first sensor 51 by turn from the directions of +x, +y, −x and −y at each quarter of the clock cycle. The second multiplexer 322 is configured to pick out the hall voltage generated by the second sensor 52 by turn from the directions of +y, +x, −y and −x at each quarter of the clock cycle. The add unit 31 is configured to add a product of the hall voltage signal from the first multiplexer 321 and a first coefficient k1 to the hall voltage signal from the second multiplexer 322, to generate the trim signal $V_{trim}$.

In one embodiment of the present invention, picking out the hall voltage generated by the first sensing unit 5011 (and/or the first sensor 51) by turn from the directions of +x, +y, −x and −y at each quarter of the clock cycle means: a) at the first quarter of each clock cycle, picking out the hall voltage generated by the first sensing unit 5011 (and/or the first sensor 51) from the +x direction; b) at the second quarter of each clock cycle, picking out the hall voltage generated by the first sensing unit 5011 (and/or the first sensor 51) from the +y direction; c) at the third quarter of each clock cycle, picking out the hall voltage generated by the first sensing unit 5011 (and/or the first sensor 51) from the −x direction; and d) at the fourth quarter of each clock cycle, picking out the hall voltage generated by the first sensing unit 5011 (and/or the first sensor 51) from the −y direction. In one embodiment of the present invention, picking out the hall voltage generated by the second sensing unit 5012 (and/or the second sensor 52) by turn from the directions of +y, +x, −y and −x at each quarter of the clock cycle means: a) at the first quarter of each clock cycle, picking out the hall voltage generated by the second sensing unit 5012 (and/or the second sensor 52) from the +y direction; b) at the second quarter of each clock cycle, picking out the hall voltage generated by the second sensing unit 5012 (and/or the second sensor 52) from the +x direction; c) at the third quarter of each clock cycle, picking out the hall voltage generated by the second sensing unit 5012 (and/or the second sensor 52) from the −y direction; and d) at the fourth quarter of each clock cycle, picking out the hall voltage generated by the second sensing unit 5012 (and/or the second sensor 52) from the −x direction.

Figure 11:
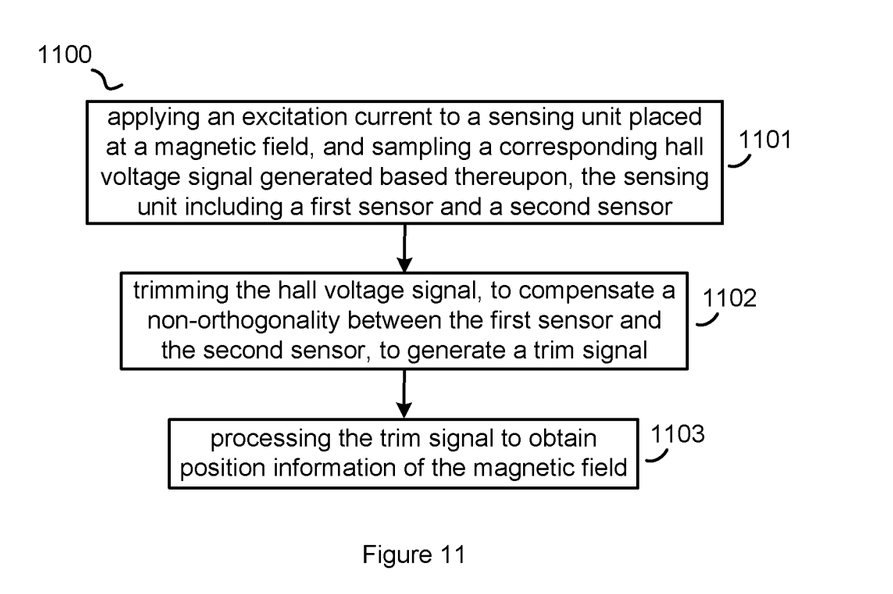
FIG. 11 schematically shows a flowchart 1100 of a position sensing method in accordance with an embodiment of the present invention.

FIG. 11 schematically shows a flowchart 1100 of position sensing method in accordance with an embodiment of the present invention. As shown in FIG. 11, the method comprises:

Step 1101, applying an excitation current to a sensing unit placed at a magnetic field, and sampling a corresponding hall voltage signal generated based thereupon, the sensing unit including a first sensor and a second sensor.

Step 1102, trimming the hall voltage signal, to compensate a non-orthogonality between the first sensor and the second sensor, to generate a trim signal.

Step 1103, processing the trim signal to obtain position information of the magnetic field.

In one embodiment of the present invention, the first sensor is place at the x direction of a sensing plane, and the second sensor is placed at the y direction of the sensing plane.

In one embodiment of the present invention, first sensor and the second sensor are applied with the excitation current by turn.

In one embodiment of the present invention, trimming the hall voltage signal in the +x direction, the +y direction, the −x direction and the −y direction, respectively, to generate the trim signal.

In one embodiment, the trimming comprises: adding a product of the hall voltage signal in the +y direction and a first coefficient to the hall voltage signal in the +x direction; adding a product of the hall voltage signal in the +x direction and the first coefficient to the hall voltage signal in the +y direction; adding a product of the hall voltage signal in the −y direction and the first coefficient to the hall voltage signal in the −x direction; adding a product of the hall voltage signal in the −x direction and the first coefficient to the hall voltage signal in the −y direction.

In one embodiment of the present invention, the trimming comprises: dividing a frequency of the hall voltage signal in each of the +x, +y, −x, −y directions into two halves, to respectively obtain a first signal and a second signal with same time length in each of the directions, wherein in either the +x direction and the −x direction, the first signal is maintained, while the second signal is multiplied with a second coefficient; and in either the +y direction and the −y direction, the first signal is multiplied with the second coefficient k2, while the second signal is maintained.

Several embodiments of the foregoing position sensing system and method provide more accurate position sense. Unlike the conventional technique, several embodiments of the foregoing position sensing system trim the hall voltage signals generated by the sensing unit, so that errors caused by the non-orthogonality between different sensors are compensated, which significantly improves the accuracy.

It is to be understood in these letters patent that the meaning of "A" is coupled to "B" is that either A and B are connected to each other as described below, or that, although A and B may not be connected to each other as described above, there is nevertheless a device or circuit that is connected to both A and B. This device or circuit may include active or passive circuit elements, where the passive circuit elements may be distributed or lumped-parameter in nature. For example, A may be connected to a circuit element that in turn is connected to B.

This written description uses examples to disclose the invention, including the best mode, and also to enable a person skilled in the art to make and use the invention. The patentable scope of the invention may include other examples that occur to those skilled in the art.

What is claimed is:

1. A position sensing system, comprising:
a sensing unit, having a first sensor and a second sensor, both configured to induce a magnetic field;
an exciting unit, configured to apply an excitation current having a clock cycle to the first sensor and the second sensor, and to obtain hall voltage signals generated by the first sensor and the second sensor;
a trim unit, configured to trim the hall voltages to generate a trim signal, so as to compensate a non-orthogonality of the first sensor and the second sensor;
a control unit circuitry configured to control a current direction and a spinning scheme of the excitation current, and to control the trim of the hall voltages; and
a signal process unit, configured to generate a signal indicative of position information of the magnetic field in response to the trim signal.

2. The position sensing system of claim 1, wherein:
under the control of the control unit, the exciting unit is configured to apply the excitation current to the first sensor and the second sensor by turn, and the excitation current has a current direction changed each quarter of the clock cycle.

3. The position sensing system of claim 1, wherein:
the first sensor and the second sensor are simultaneously applied with excitation currents having opposite directions.

4. The position sensing system of claim 1, wherein:
the first sensor and the second sensor are placed perpendicular with each other, and are respectively placed in the y direction and in the x direction of a sensing plane.

5. The position sensing system of claim 1, wherein:
a current direction of the excitation current is changed each quarter of the clock cycle, so that hall voltages are generated by turn in the +x, +y, −x and −y directions of a sensing plane at each quarter of the clock cycle; and
the trim unit is configured to trim the hall voltages in each of the x, +y, −x and −y directions to generate the trim signal.

6. The position sensing system of claim 5, wherein the trim unit further comprises:
an add unit, configured to respectively compensate the hall voltages in the +x, +y, −x and −y directions with a first coefficient: a product of the hall voltage in the +y direction and the first coefficient is added to the hall voltage in the +x direction, a product of the hall voltage in the +x direction and the first coefficient is added to the hall voltage in the +y direction, a product of the hall voltage in the −y direction and the first coefficient is added to the hall voltage in the −x direction, and a product of the hall voltage in the −x direction and the first coefficient is added to the hall voltage in the −y direction; and
a multiplexer, configured to pick out the hall voltages from the add unit under the control of the control unit to generate the trim signal.

7. The position sensing system of claim 5, wherein the trim unit further comprises:
a frequency divide unit, configured to divide a frequency of the hall voltages in each of the +x, +y, −x and −y directions into two halves, to respectively obtain a first signal and a second signal in each of the directions; wherein in each of the directions, the first signal and the second signal have a same time length; and wherein in either the +x direction and the −x direction, the first signal is maintained, while the second signal is multiplied with a second coefficient; and in either the +y direction and the −y direction, the first signal is multiplied with the second coefficient, while the second signal is maintained; and
a multiplexer, configured to pick out an output signal from the frequency divide unit to generate the trim signal.

8. A position sensing system, comprising:
a first sensing unit, having a first sensor and a second sensor, both configured to induce a magnetic field;
a second sensing unit, having a first sensor and a second sensor, both configured to induce the magnetic field;
an exciting unit, configured to in turn apply an excitation current having a clock cycle to the first sensing unit and the second sensing unit, and to obtain a first hall voltage signal generated by the first sensing unit and a second hall voltage signal generated by the second sensing unit;
a trim unit, configured to add a product of the second hall voltage signal and a first coefficient into the first hall voltage signal, to generate a trim signal, so as to compensate a non-orthogonality between the first sensor and the second sensor in the first sensing unit, and to compensate a non-orthogonality between the first sensor and the second sensor in the second sensing unit; and a signal process unit, configured to generate a signal indicative of position information of the magnetic field in response to the trim signal.

9. The position sensing system of claim 8, wherein:
in each of the first sensing unit and the second sensing unit, the first sensor and the second sensor are placed in perpendicular with each other, and are respectively placed in the y direction and the x direction of a sensing plane.

10. The position sensing system of claim 8, wherein:
in each of the first sensing unit and the second sensing unit, the first sensor and the second sensor are applied with the excitation current by turn; and
a current direction of the excitation current is changed each quarter of the clock cycle, so that:
in the first sensing unit, a hall voltage is generated in the +x direction at a first quarter of the clock cycle, the hall voltage is generated in the +y direction at a second quarter of the clock cycle, the hall voltage is generated in the −x direction at a third quarter of the clock cycle, and the hall voltage is generated in the −y direction at a fourth quarter of the clock cycle, to form the first hall voltage; and
in the second sensing unit, the hall voltage is generated in the +y direction at a first quarter of the clock cycle, the hall voltage is generated in the +x direction at a second quarter of the clock cycle, the hall voltage is generated in the −y direction at a third quarter of the clock cycle, and the hall voltage is generated in the −x direction at a fourth quarter of the clock cycle, to form the second hall voltage.

11. The position sensing system of claim 10, wherein the trim unit comprises:
a first multiplexer, configured to pick out the hall voltages generated by the first sensing unit from the +x, +y, −x and −y directions by turn at each quarter of the clock cycle;
a second multiplexer, configured to pick out the hall voltages generated by the second sensing unit from the +y, +x, −y and −x directions by turn at each quarter of the clock cycle; and
an add unit, configured to add a product of the hall voltages from the first multiplexer and the first coefficient into the hall voltages from the second multiplexer, to generate the trim signal.

* * * * *